(12) United States Patent
Chen et al.

(10) Patent No.: US 6,504,207 B1
(45) Date of Patent: Jan. 7, 2003

(54) METHOD TO CREATE EEPROM MEMORY STRUCTURES INTEGRATED WITH HIGH PERFORMANCE LOGIC AND NVRAM, AND OPERATING CONDITIONS FOR THE SAME

(75) Inventors: Bomy A. Chen, Ridgefield, CT (US); Jay G. Harrington, Monroe, CT (US); Kevin M. Houlihan, South Boston, MA (US); Dennis Hoyniak, Essex Junction, VT (US); Chung Hon Lam, Williston, VT (US); Hyun Koo Lee, LaGrangeville, NY (US); Rebecca D. Mih, Wappingers Falls, NY (US); Jed H. Rankin, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 09/609,292

(22) Filed: Jun. 30, 2000

(51) Int. Cl.[7] .............................................. H01L 29/76
(52) U.S. Cl. ...................... 257/319; 257/316; 257/321; 438/258
(58) Field of Search ................................ 257/315, 316, 257/317, 319, 321; 438/257, 258, 259, 264

(56) References Cited

U.S. PATENT DOCUMENTS

| 5,091,882 A | * | 2/1992 | Naruke | 365/185.14 |
|---|---|---|---|---|
| 5,212,541 A | * | 5/1993 | Bergemont | 257/202 |
| 5,284,784 A | * | 2/1994 | Manley | 257/319 |
| 5,380,672 A | * | 1/1995 | Yuan et al. | 365/185.02 |
| 5,614,747 A | * | 3/1997 | Ahn et al. | 257/316 |
| 5,918,124 A | * | 6/1999 | Sung | 438/258 |
| 5,986,941 A | * | 11/1999 | Pang et al. | 365/185.15 |
| 5,991,204 A | * | 11/1999 | Chang | 365/185.01 |
| 6,157,058 A | * | 12/2000 | Ogura | 257/314 |
| 6,271,091 B1 | * | 8/2001 | Park | 438/257 |
| 6,426,257 B1 | * | 7/2002 | Kanamori | 438/266 |

OTHER PUBLICATIONS

Y. Ma et al., A Dual–bit Split–Gate EEPROM (DSG) Cell in Contactless ARray for Single–Vcc High Density Flash Memories, 1994, IEEE, IEDM 94, pp. 57–60.*

* cited by examiner

*Primary Examiner*—Eddie Lee
*Assistant Examiner*—George C. Eckert, II
(74) *Attorney, Agent, or Firm*—McGinn & Gibb, PLLC; Daryl K. Neff (57) ABSTRACT

A method and structure for a EEPROM memory device integrated with high performance logic or NVRAM. The EEPROM device includes a floating gate and program gate self-aligned with one another. During programming, electron tunneling occurs between the floating gate and the program gate.

10 Claims, 7 Drawing Sheets

METHOD TO CREATE EEPROM MEMORY STRUCTURES INTEGRATED WITH HIGH PERFORMANCE LOGIC AND NVRAM, AND OPERATING CONDITIONS FOR THE SAME

FIELD OF THE INVENTION

The present invention generally relates to an EEPROM (Electronically Erasable Programmable Read Only Memory) structure, and in particular, an EEPROM memory structure integrated with high performance logic or non-volatile random access memory (NVRAM).

DESCRIPTION OF THE RELATED ART

A conventional EEPROM device generally includes a program gate, a floating gate, and a single select device wordline. During manufacturing, the program gate and floating gate must be aligned to a thin oxide tunnel region. Also, multiple masking steps are necessary to form the floating gate, program gate, and source/drain implantations. Further, the oxide tunnel region, located between the floating gate and an n⁻-type region of a silicon substrate must be sufficiently thin (e.g. 8 to 11 nm) to permit electrons to tunnel between the floating gate and the silicon substrate.

An example of a conventional EEPROM device fabrication can be found in U.S. Pat. No. 5,081,054 and its associated re-issue U.S. Pat. No. Re. 35,094.

Figure 1:
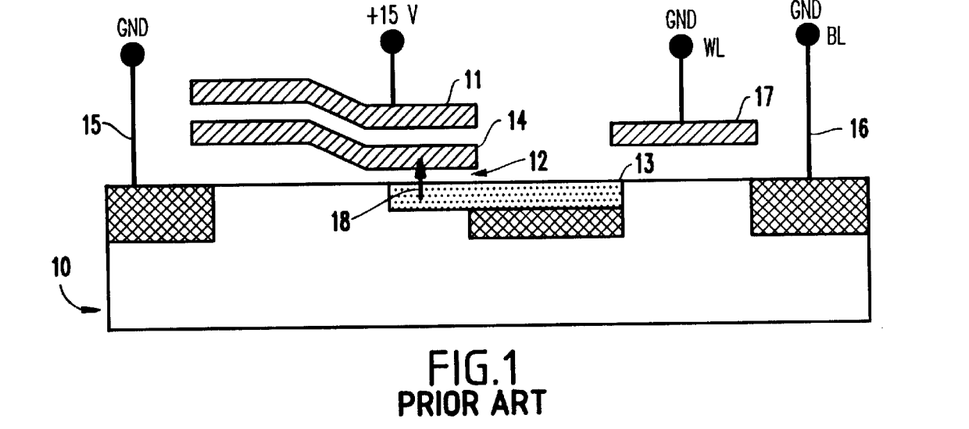
FIG. 1 is a schematic diagram of a conventional EPROM device during an erasing process.

Referring to FIG. 1, erasing a conventional EEPROM device 10 occurs by applying a sufficient voltage to program gate 11 to allow electrons to tunnel through a tunnel oxide region 12 located over the n⁻-type region 13. Typically, a voltage of 15 volts is necessary to allow electron tunneling. Further, the tunnel oxide 12 must be thin enough to allow electron tunneling to occur at the applied bias conditions.

Electrons that tunnel from the data node 13 to the floating gate 14 as depicted by arrow 18 remain there and give the floating gate 14 a negative charge. Standard bias conditions to erase a conventional EEPROM device generally utilize a setting source 15, drain bitline 16 and wordline 17 connect to ground.

A conventional EEPROM has only a single wordline since isolation of the data node (tile diffusion between the wordline gate and the floating gate 14 (i.e., data node), and its extension under the floating gate 14) during a programming operation requires only one wordline. The erase operation is done in a page mode per wordline) and does not require isolation.

Figure 2:
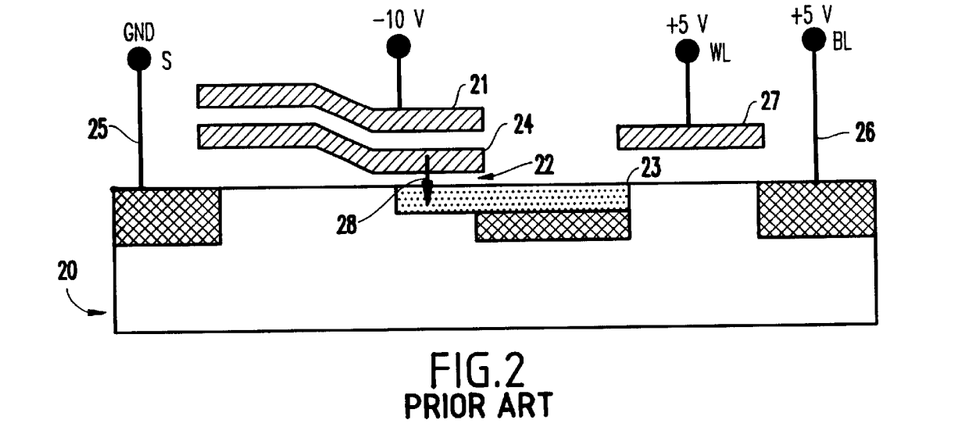
FIG. 2 is a schematic diagram of a conventional EEPROM device during programming "1"

The conventional EEPROM requires one erase operations before it is programmed selectively as either "1" or "0". More specifically, referring to FIG. 2, a conventional EEPROM device 20 is programmed to a "1" by applying a 5 volt signal to bitline 26. The silicon surface potential of the n⁻-type region 23 is therefore fixed at 5 volts and is sufficient to produce an electric field across the tunnel oxide 22 to allow electron tunneling between the floating gate 24 and the n⁻-type region 23 of the substrate. Following this operation, the floating gate 24 has a positive potential as a result of electrons tunneling between the floating gate and the n⁻-type region 23 as depicted by arrow 28.

Figure 3:
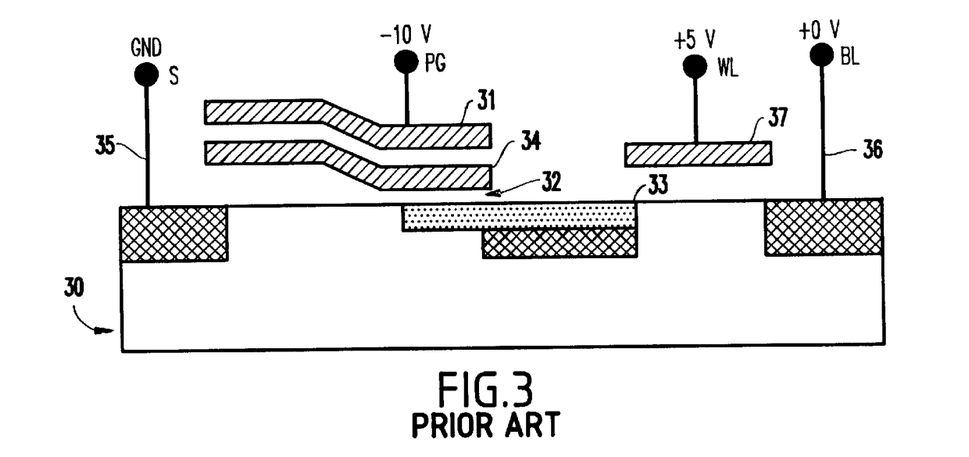
FIG. 3 is a schematic diagram of a conventional EEPROM device during programing "0"

Referring to FIG. 3, the EEPROM 30 is programmed to "0" by setting the voltage potential at bitline 36 and consequently the silicon surface potential in the n⁻-type region 33 to 0 volts. In addition, the source 35 is set to ground, the program gate 31 is set to −10 volts and wordline 37 is set to +5 volts. The electric field across the tunnel oxide 32 is insufficient to initiate electron tunneling between the floating gate 34 and the n⁻-type region 32. As a result, the floating gate 32 charge remains at its erased value.

One disadvantage with conventional EEPROM manufacturing is the use of multiple masking steps to form a floating gate, a program gate, and source/drain implantations. Further, in conventional EEPROM manufacturing, the program gate and floating gate have to be aligned to a thin oxide tunnel region of the substrate. Such additional steps and alignment add costs and complexity to the manufacturing of conventional EEPROM devices.

An additional disadvantage with conventional EEPROM devices is the requirement of relatively high voltages, e.g. around 15 volts, to initially erase the conventional EEPROM memory device.

A third disadvantage of conventional EEPROM devices is the requirement of manufacturing a thin tunnel oxide between the floating gate and the n⁻-type region of the silicon substrate to allow electron tunneling when a sufficient voltage is applied to the program gate.

A fourth disadvantage of conventional EEPROM devices is the possibility of damage to the floating gate oxide through multiple program/erase cycles. As a result, the operation of the memory cell could be affected during read operations.

A fifth disadvantage of the conventional EEPROM is that the fabrication process interferes with the limited thermal budgets of high performance CMOS logic processes in embedded EEPROM applications.

SUMMARY OF THE INVENTION

In view of the foregoing and other problems, disadvantages, and drawbacks of the conventional EEPROM device, the present invention has been devised, and it is an object of the present invention to provide a structure and method for an EEPROM device in which electron tunneling occurs between a floating gate and a program gate during programming. The electric field between the floating gate and the program gate can be enhanced by the use of silicon rich oxide on the facing surfaces of the floating gate and the program gate. As a result of the electron tunneling between the floating gate and the program gate, the voltage necessary to erase the EEPROM device is less than the voltage required to erase conventional EEPROM devices.

An additional object of the present invention is to provide an EEPROM device having a floating gate and program gate self-aligned with one another whereby not requiring additional masking and etching steps to achieve proper alignment.

Another object is to provide an EEPROM device integrateable with high performance logic (e.g. complementary metal oxide semiconductor (CMOS)) or non-volatile random access memory (NVRAM) and a bidirectional polysilicon to polysilicon EEPROM device.

According to one aspect of the invention, the memory device is formed on a silicon substrate. The memory device includes a floating gate, a program gate, and at least one select device. During programming of the memory device, electrons tunnel between the program gate and the floating gate.

According to another aspect of the invention, a memory device is formed on a silicon substrate. The memory device includes a floating gate, a program gate, a first select device and a second select device. In one form, thereof, the floating gate is formed of an amorphous polysilicon between two oxide layers.

According to yet another aspect of the invention, a memory device is formed on a substrate having layers of a base silicon, a first oxide layers and amorphous silicon layer, and a second oxide layer. The method includes depositing a sacrificial layer on the substrate. A trench is patterned an etched through the sacrificial layer. A conductor is deposited into the trench and the sacrificial layer is removed. A third oxide layer is deposited adjacent to the conductor. At least one wordline is formed adjacent the conductor. As a result of the method, the conductor is self-aligned with the amorphous polysilicon layer.

The invention, in another form thereof, is a method of programming an EEPROM device having a program gate and floating gate. The method includes selectively turning on and off at least one wordline and applying a voltage to the program gate whereby permitting electron tunneling between the program gate and the floating gate.

BRIEF DESCRIPTION OF THE DRAWINGS

FIGS. 4(a)–4(i) are a schematic diagrams depicting a process for forming a EEPROM device according to one aspect of the invention, wherein

DETAILED DESCRIPTION OF PREFERRED EMBODIMENTS OF THE INVENTION

Referring now to the drawings, and more specifically to FIGS. 4(a)–4(i), there is shown a preferred embodiment of a method and structure according to the present invention.

Figure 4A:
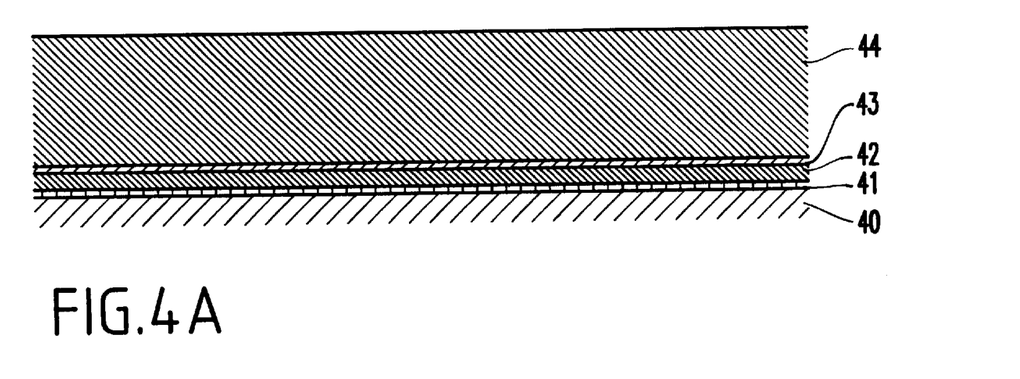
FIG. 4(a) depicts post shallow trench isolation and deposition of a thick nitride layer.

In FIG. 4(a), silicon 40 acts as a substrate upon which thermal oxide 41, amorphous polysilicon 42 and pad oxide 43 are deposited. In a preferred embodiment, the thermal oxide layer 41 is 60 Å, the amorphous polysilicon layer 42 is 500 Å and the pad oxide layer 43 is 90 Å. The pad oxide layer 43 may range between 80 Å and 100 Å.

Using shallow trench isolation (STI) processing, the starting material is patterned, etched and polished. Nitride layer 44 is deposited on the substrate, preferably by using a plasma chemical vapor deposition to a thickness of approximately 3000 Å. Nitride layer 44 acts as a sacrificial layer which will be removed in a subsequent step.

Figure 4B:
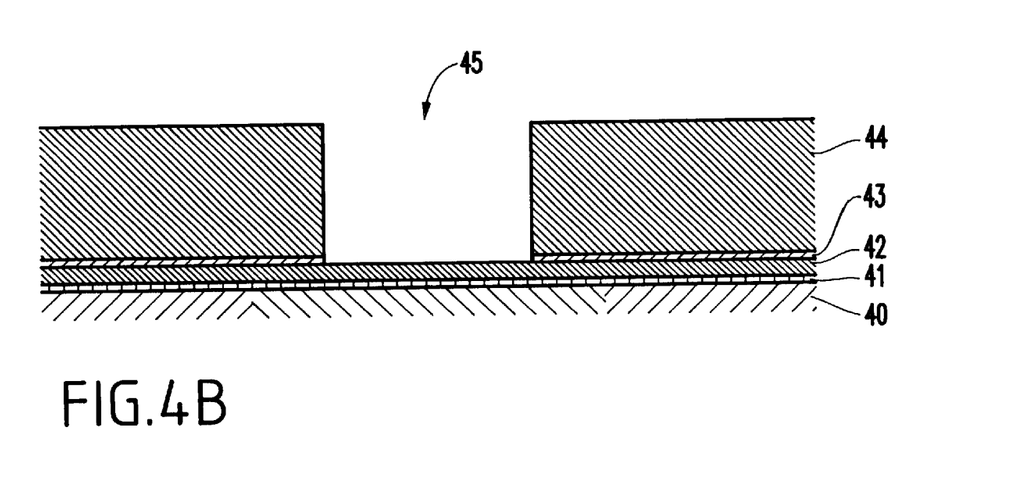
FIG. 4(b) depicts nitride reaction ion etching and trench formation.
Figure 4C:
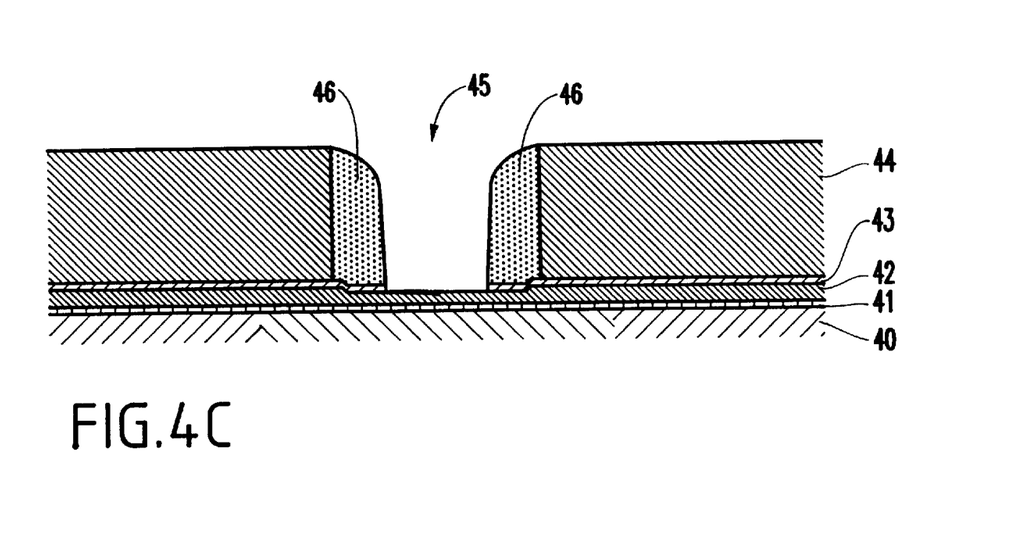
FIG. 4(c) depicts deposition and etching of an oxide spacer.
Figure 4D:
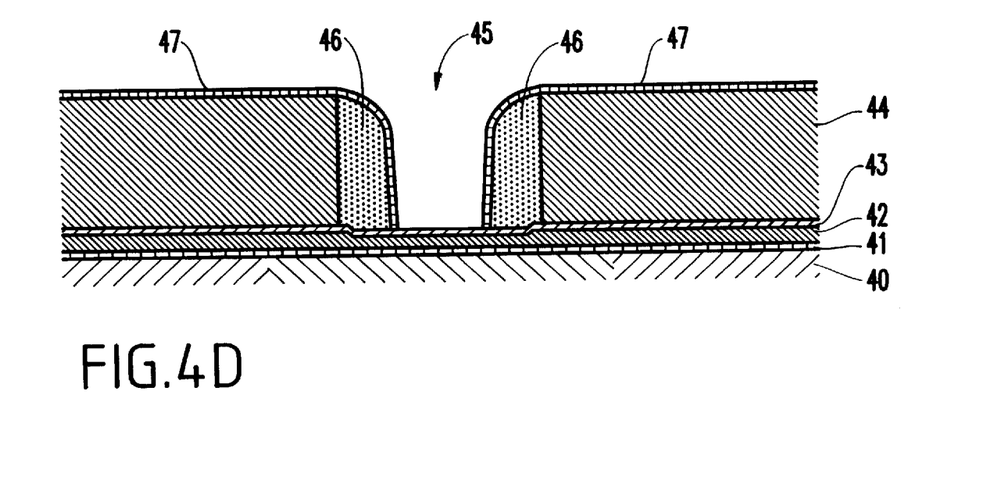
FIG. 4(d) depicts deposition of a silicon-rich oxide.

Referring to FIG. 4(b), trench 45 is formed by patterning and etching into nitride layer 44 stopping on the pad oxide layer 43. A mask is applied to pattern the trench into the nitride layer 44. This is the only masking step required of the formation of the EEPROM cell. Oxide spacer 46 is deposited and etched along the sidewalls of trench 45 as depicted in FIG. 4(c). Referring to FIG. 4(d), a silicon-rich oxide layer 47 is deposited on oxide spacer 46. A silicon-rich oxide is an off-stoichiometric silicon oxide which contains more silicon than a stoichiometrically balanced silicon dioxide. In one preferred embodiment, silicon-rich oxide layer 47 comprises layers of 60 Å silicon-rich oxide, 60 Å stoichiometric silicon dioxide, and 60 Å silicon-rich oxide. Preferred range of the top and bottom silicon rich layers and the intermediate stoichiometric silicon dioxide layer is 50 Å to 100 Å.

Figure 4E:
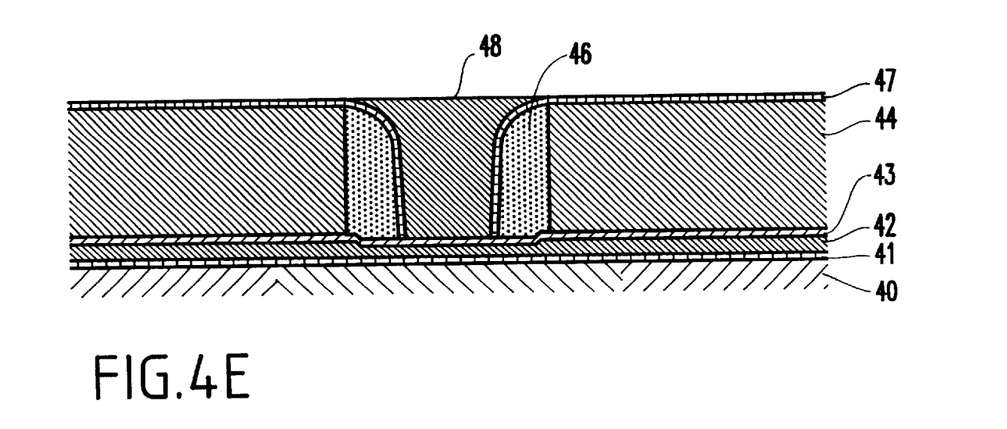
FIG. 4(e) depicts program gate poly silicon plug deposition.
Figure 4F:
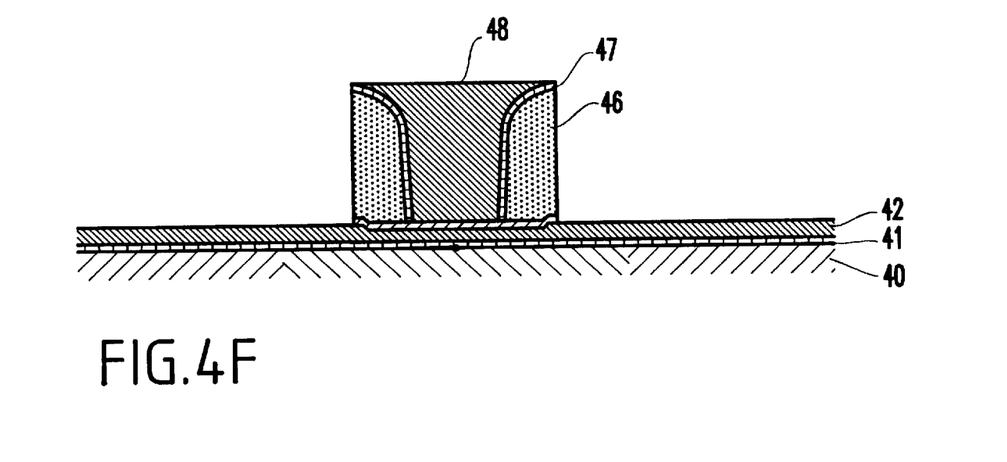
FIG. 4(f) depicts post removal of the thick nitride layer.
Figure 4G:
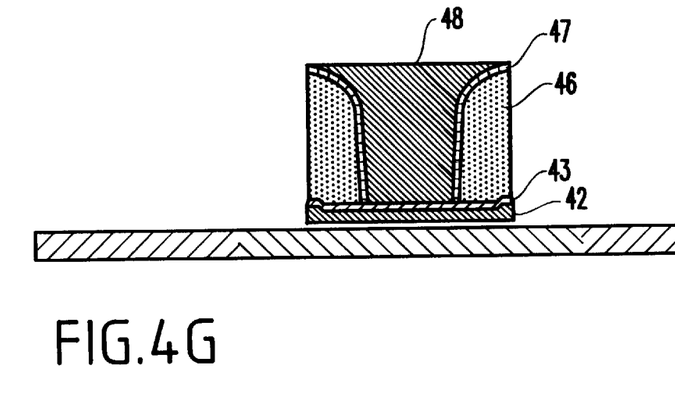
FIG. 4(g) depicts etching away of the amorphous polysilicon.

Referring to FIGS. 4(e) and 4(f) an in-situ doped n-type polysilicon conductor 48 is formed by depositing and polishing polysilicon to be even with nitride layer 44. Nitride layer 44 is stripped using conventional techniques known in the art as depicted in FIG. 4(f) to leave a stack structure An anisotropic reactive ion etch removes the amorphous silicon layer 42 and a diluted hydrofluoric acid clears the pad oxide layer 43 in the regions outside the stack structure exposed by the removal of the nitride layer 44 (FIG. 4(g)).

Figure 4H:
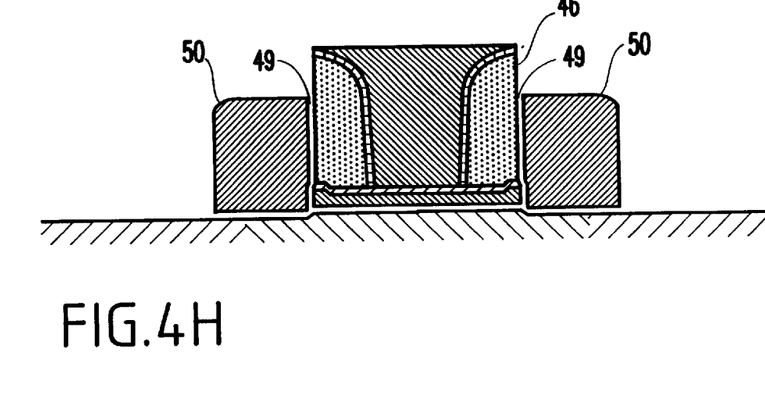
FIG. 4(h) depicts wordline spacer formation.

As shown in FIG. 4(h), wordline oxide 49 and polysilicon layer 50 are deposited on either side of the stacked structure adjacent the oxide spacer 46. The polysilicon 50 is etched using RIE. Preferred wordline oxide thickness ranges from 120 Å to 200 Å. Preferred thickness of the wordline polysilicon ranges from 1500 Å to 2000 Å.

Figure 4I:
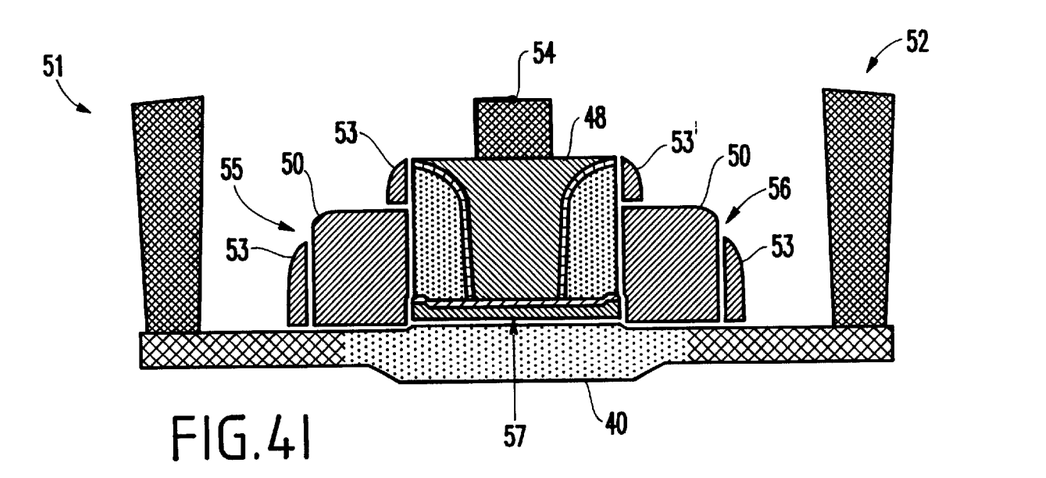
FIG. 4(i) depicts source/drain implantation.

Referring now to FIG. 4(i), the drain 51 and source 52 are implanted. Silicide can be formed on polysilicon 50 along with the drain 51 and source 52 diffusions on the silicon substrate after the nitride spacer 53 is formed by conventional process. Program gate contact 54 is formed on conductor 48. Wordlines 55, 56 act as select devices. Floating gate 57 comprises amorphous polysilicon 42 formed between oxide layers 41 and 43 below the program gate conductor 48.

In the EEPROM device depicted in FIGS. 4(a)–4(i) and described in the method above, since program gate conductor 48 and floating gate 57 are formed within trench 45 and on pad oxide 43, the program gate conductor 48 is self-aligned with floating gate 57 and pad oxide 43. As a result, the present invention does not require masking steps and etching to properly align the program gate conductor 48 with the floating gate 57 and/or oxide pad 43.

In addition, the present EEPROM device provides for two select devices, i.e. wordline 55 and 56 formed adjacent (i.e. along either side of) a memory device. Further, since wordlines 55 and 56 are formed adjacent, and on opposite sides of conductor 48, the present EEPROM device provides for miniaturization of an EEPROM device with two select devices compared with the size of a conventional EEPROM device required to incorporate two select devices.

Further, during programming, electrons tunnel between floating gate 57 and program gate 48 (programming method to follow). Unlike conventional EEPROM devices, the EEPROM device of the present invention does not have electrons tunneling between the floating gate 57 and silicon substrate 40. The electrical field between the floating gate 57 and the program gate 48 is enhanced by the use of silicon-rich oxide on the facing surfaces of the floating gate and the program gate. As a result, the voltage required to provide electron movement between program gate 48 through oxide layer 43, to floating gate 57 is less than the voltage potential necessary in the conventional EEPROM device 10 to provide electron tunneling between a n⁻-type region 13 on a silicon substrate through the tunnel oxide 12 and on to the floating gate 14 where enhancement of electric field is not possible due the requirement of stoichiometric silicon dioxide for the floating gate device MOS dielectric. (FIG. 1).

As a result of the silicon rich oxide between the floating gate polysilicon 57 and the program gate 48 polysilicon, there is a decrease in voltage potential necessary to erase and program the present EEPROM device as compared to the conventional EEPROM device 10.

In addition, since, during program/erase functions of the preset EEPROM device, electrons tunnel between the amorphous polysilicon of conductor 48 to the floating gate 57, rather than from the floating gate 57 through the floating gate oxide (i.e. thermal oxide 41), electron tunneling does not pose potential harm to the floating gate oxide which also act as the gate oxide of the floating gate device.

Figure 5:
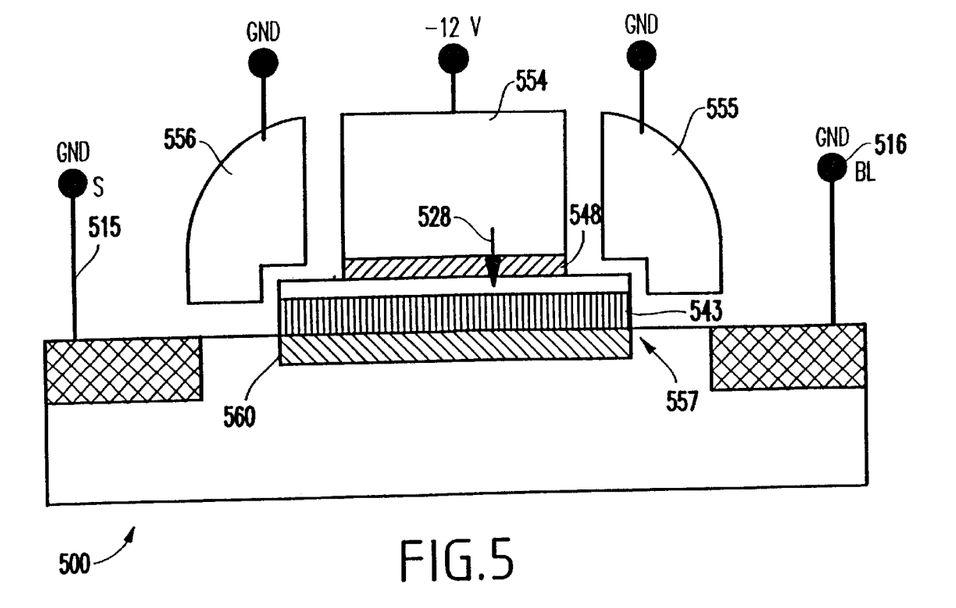
FIG. 5 depicts EEPROM erasing of an EEPROM according to one aspect of the present invention.
Figure 6:
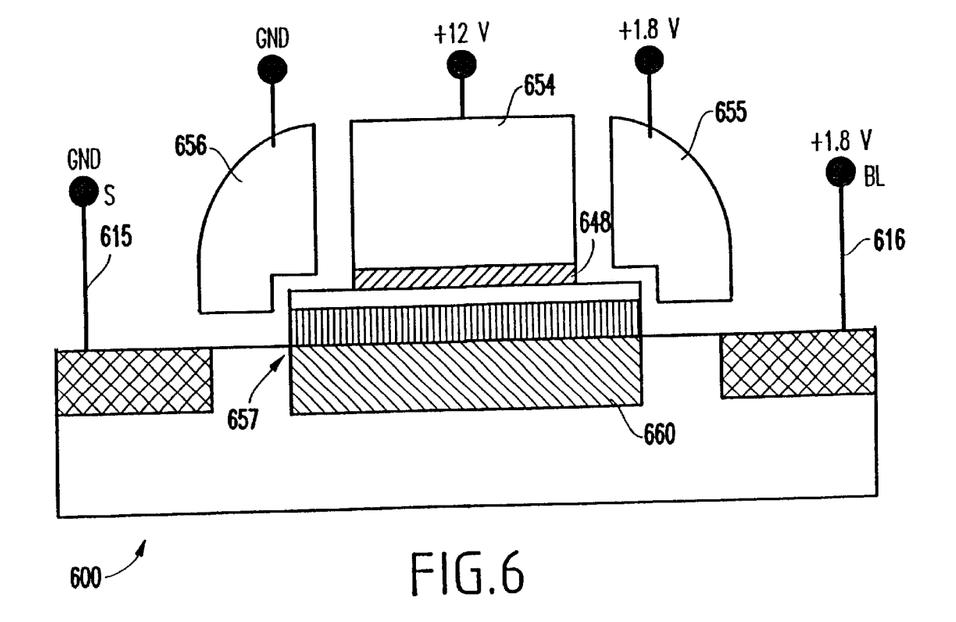
FIG. 6 depicts programming "0" conditions for an EEPROM according to one aspect of the present invention.
Figure 7:
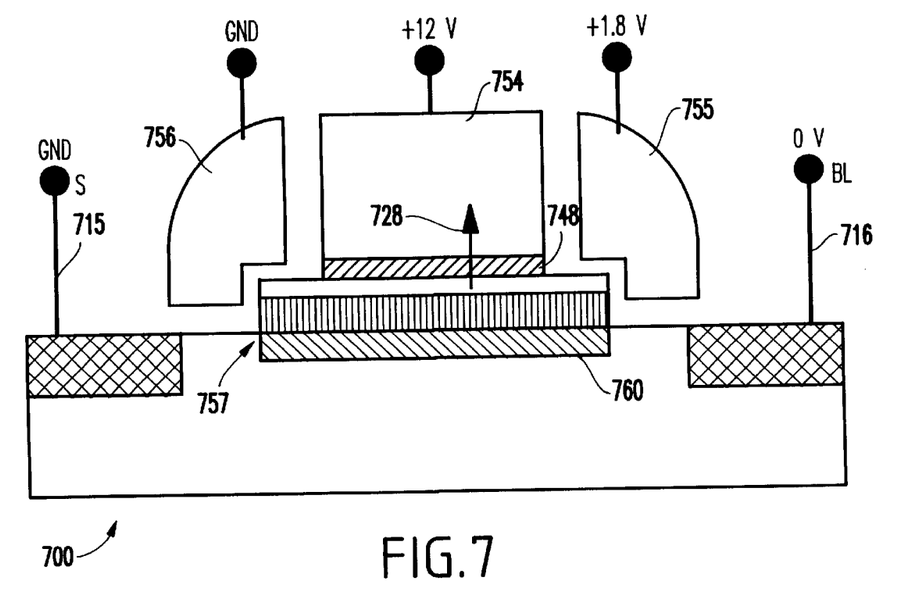
FIG. 7 depicts programming "1" conditions for an EEPROM one aspect of the present invention.

Referring now to FIGS. 5–7, the EEPROM device is erased and programmed as "0" or "1". Specifically referring to FIG. 5, the biased conditions to erase EEPROM 500 are depicted. The electric field across the silicon rich oxide layer 548 is sufficient to allow electrons to tunnel between the silicon rich oxide 548 of program gate 554 through pad oxide 543 to the floating gate 557 as depicted by arrow 528.

Source 515, drain/bitline 516, wordline 555, and wordline 556 are set to ground. The voltage potential applied to program gate 554 is –12 volts. Using these bias conditions in an erase operation, the floating gate 557 will attain a net negative charge. Under these bias conditions, the silicon subtrate in the floating gate channel region 560 is in accumulation. The equivalent capacitance circuit is depicted in FIG. 9.

To obtain an electric field required to initiate electron tunneling through the silicon rich oxide 548, the program gate to floating gate capacitance (C1) and floating gate to silicon capacitance (Cox) must be adjusted as described below.

Figure 9:
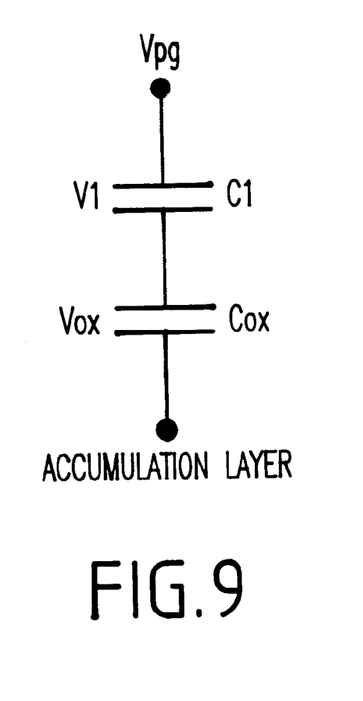
FIG. 9 is an electrical schematic for erasing an EEPROM device of the present invention.

Referring to FIG. 9, Vpg is the voltage applied to the program gate (PG). V1 is the voltage across C1. C1 is the program gate (PG) to floating gate (FG) capacitor. Cox is the FG to Silicon capacitor. Vox is the voltage across Cox.

For illustrative purposes only, the conditions for erasing the present EEPROM device, (i.e. for tunneling to occur), V1>6.0 V.

If V1>6 V than $$V1 = Vpg \cdot \left(\frac{Cox}{C1 + Cox}\right)$$

requires that $$12 \cdot \left(\frac{Cox}{C1 + Cox}\right) > 6$$

or

Cox>C1

If Cox>C1 and Vpg=12 V, then the voltage drop across C1 is >6 V and electron tunneling can occur. While this example requires V1>V to initiate tunneling, this is not necessarily the case in all EEPROM devices according to the present invention and therefore should not be interpreted as a limitation of the present EEPROM device. The accumulated electric field across the silicon rich oxide is high enough to initiate tunneling.

Referring now to FIG. 6, there is no electron tunneling between floating gate 657 and program gate 654. As a result, the floating gate 657 retains its net negative charge produced during the erasing process. To program a "0" into the EEPROM, the bias conditions are source 615 and wordline 656 set to ground, program gate 654 set to +12 volts, wordline 655 set to +1.8 volts and drain/bitline 616 set to +1.8 volts.

Figure 10:
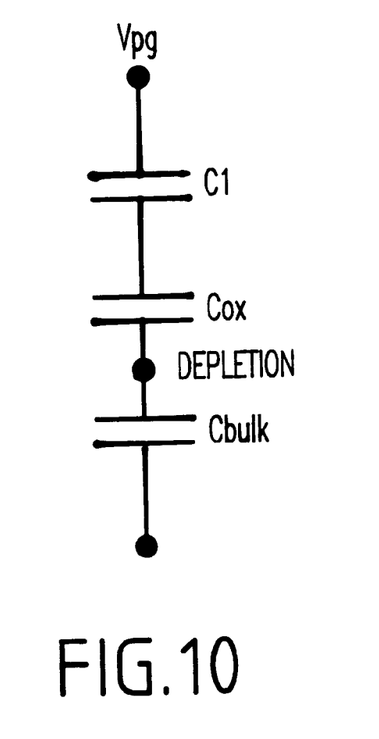
FIG. 10 is an electrical schematic for programming "0" an EEPROM device of the present invention.

Consequently, wordline 655 is in an off condition. With the wordline 655 device off, region 660 under floating gate 657 goes into deep depletion. The voltage drops across depletion region 660 prevents an electric field across the silicon rich oxide 648 from becoming large enough to initiate electron tunneling. Therefore, the charge on the floating gate 657 will remain at its erased value. The equivalent capacitance circuit for program "0" condition is depicted in FIG. 10 in which the deep depletion 660 is represented by the bulk capacitor Cbulk in series with the floating gate oxide capacitance Cox.

For illustrative purposes only, the conditions for programming a "0" in EEPROM device 600, (i.e. no tunneling), V1<6.0 V.

The series combination of Cox and Cbulk can be expressed as:

$$C = \frac{Cox}{\sqrt{1 + \frac{2 \cdot Vc}{Vo}}} \text{ where } Vo = \frac{q \cdot Ks \cdot \varepsilon 0 \cdot Nb}{Cox^2}$$

For no electron tunneling to occur:

$$V1 = Vpg \cdot \left(\frac{C}{C1 + C}\right) < 6V$$

If Vpg=12 V, the condition for no tunneling can be written as:

$$\frac{Cox}{\sqrt{1 + \frac{2 \cdot Vc}{Vo}}} < C1$$

If C<C1 and Vpg=12 V, then the voltage drop across C1 is <6 V and electron tunneling will not occur. The series capacitance (C) and C1 is adjusted so that when the silicon surface is in deep depletion, the electric field across the silicon-rich oxide is not high enough to initiate tunneling. The requirement for C<C1 is easily attained since with the depletion capacitance CbuLk is generally about 20% of that of Cox, which dominates the value of C.

While this example uses a V1>6 V for demonstrating when electron tunneling will not occur, this is merely for exemplary purposes and in no way should be intepreted as a limitation of the present EEPROM device.

Figure 11:
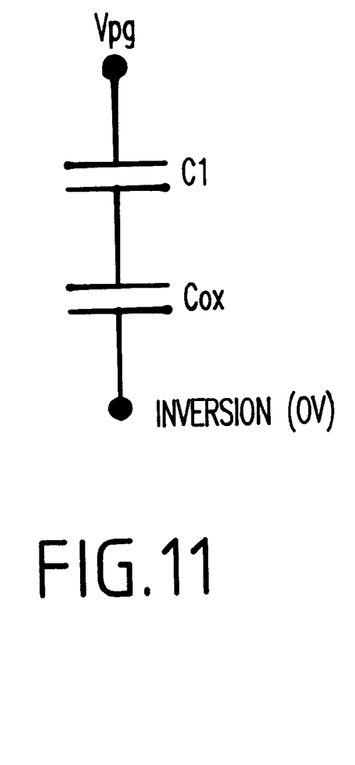
FIG. 11 is an electrical schematic for programming "1" an EEPROM device of the present invention.

Referring now to FIG. 7, depicted are the bias conditions to program "1". Source 715 and wordline 756 are set to ground. A voltage potential of 12 volts is applied to program gate 754 and a voltage potential of 1.8 volts is applied to wordline 755. The drain/bitline 716 is set to 0 volts. Using these bias conditions, wordline 755 and floating gate plate 760 (i.e. the region under floating gate 757) is inverted. An electric field across the silicon rich oxide layer 748 is high enough to initiate electron tunneling between floating gate 757 and program gate 754 as depicted by arrow 728. The net negative charge on the floating gate 757 (charge state of the floating gate plate 760 (i.e. region 560 after the erase operation (FIG. 5)) is drained off and the charge on floating gate plate 760 returns to a neutral or slightly positive state. The conditions for this to occur are the same as for the erase condition described above (i.e. C1<Cox). The equivalent capacitance circuit for program "1" bias condition is depicted in FIG. 11 (discussed below).

Figure 8:
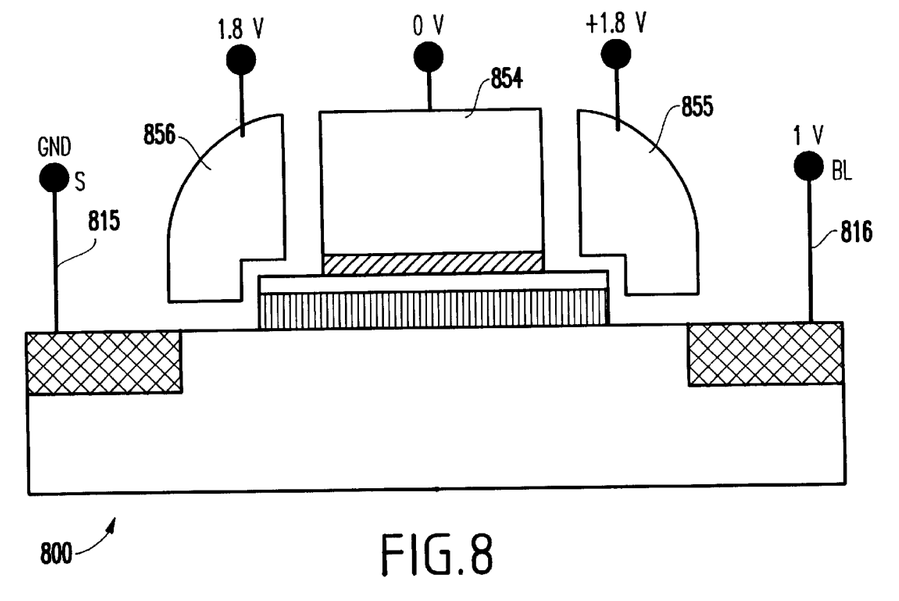
FIG. 8 depicts use of a bit line current differential to sense an EEPROM cell state.

Referring to FIG. 8, the voltage potential of bitline 816 can be used to differentiate between the program state of the EEPROM device 800. When the bitline voltage potential is positive, as depicted in FIG. 8, the EEPROM device 800 is "0". In the "0" case, the floating gate stores no or negative charge as a result of the programming operation described in FIG. 6, the floating gate is turned off. However, when the bitline has a voltage of 0, (FIG. 7), EEPROM device 700 is "1". In the "1" case, the floating gate stores positive charge as a result of the programming operation described in conjunction of FIG. 7.

The EEPROM device of the present invention provides features and advantages over conventional EEPROM devices. Using the method described in FIG. 4, program gate 54 and floating gate 48 are self-aligned. As a result, the EEPROM device of the present invention does not require masking steps and etching to properly align the program gate 54 with the floating gate 57.

A second advantage of the EEPROM device is having two select devices, i.e. wordline 55 and 56 formed adjacent (i.e. along either side of) a memory device. As a result, miniaturization is enhanced by the present EEPROM design by providing two self-aligned select devices, one on either side of a memory device. The use of two wordline completely isolates the memory cell in a memory cell during programming and erase operations for ease of decoding.

A third advantage of the present EEPROM device is that during programming, electrons tunnel between floating gate 557 and program gate 55 (FIG. 5). Unlike conventional EEPROM devices, the EEPROM device of the present invention does not have electrons tunneling between the floating gate 57 and silicon substrate 40. The voltage required to provide electron movement between program gate 554 through oxide layer 543, to floating gate 557 (FIG. 5), is less than the voltage potential necessary in conventional EEPROM devices to provide electron tunneling between a n⁻-type region 13 at a silicon substrate through the tunnel oxide 12 and on to the floating gate 14 (FIG. 1). As a result, there is a decrease in voltage potential necessary to erase the present EEPROM device as compared to conventional EEPROM devices.

A fourth advantage of the present EEPROM device is the avoidance of potential damage to the floating gate oxide (e.g. thermal oxide 41 (FIG. 4(i)) during program/erase operations. Since, during program/erase functions, electrons tunnel between the amorphous polysilicon of conductor 48 to the floating gate 57 rather than through the floating gate oxide, the present EEPROM device avoids potential harm to the floating gate oxide (i.e. thermal oxide 41).

While the invention has been described in terms of preferred embodiments, those skilled in the art will recognize that the invention can be practiced with modification within the spirit and scope of the appended claims.

What is claimed is:

1. A memory device formed on a silicon substrate, comprising:
   a floating gate;
   a program gate;
   a first select device and a second select device, said first select device and said second select device both being self-aligned to said floating gate and said program gate; and
   first and second substantially vertical dielectric spacers interposed between said program gate and said first select device and said second select device, respectively, but not between said floating gate and said first select device and said second select device,
   wherein said first select device and said second select device comprise a first wordline and a second wordline, respectively.

2. A memory device of claim 1, wherein said program gate comprises polysilicon formed between silicon-rich oxide layers.

3. A memory device of claim 1 further comprising a dielectric layer interposed between said floating gate and said program gate, said dielectric layer adapted to enhance tunneling of electrons between said floating gate and said program gate during programming.

4. A memory device of claim 3 wherein said dielectric layer is further adapted to enhance tunneling of electrons between said floating gate and said program gate during erasing.

5. A memory device of claim 3 wherein said dielectric layer comprises silicon-rich oxide.

6. A memory device of claim 3 wherein said dielectric layer further comprises a layer of stoichiometric silicon dioxide.

7. A memory device of claim 6 wherein said dielectric layer comprises a layer of stoichiometric silicon dioxide between two layers of silicon-rich oxide.

8. A memory device of claim 7 wherein said layer of stoichiometric silicon dioxide has thickness of about 60 Å.

9. A memory device of claim 8 wherein at least one of said layers of silicon-rich oxide has thickness of about 60 Å.

10. A memory device of claim 9 wherein both of said layers of silicon-rich oxide have thickness of about 60 Å.

* * * * *